(12) United States Patent
Demura et al.

(10) Patent No.: US 6,357,030 B1
(45) Date of Patent: Mar. 12, 2002

(54) ECC BLOCK FORMAT FOR STORAGE DEVICE

(75) Inventors: Masayuki Demura, Ebina; Tetsuya Tamura, Yamato; Akira Sasaki, Kyoto; Hiroshi Itagaki, Yamato, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/216,014

(22) Filed: Dec. 16, 1998

(30) Foreign Application Priority Data

Dec. 16, 1997 (JP) .............................. 9-346438

(51) Int. Cl.[7] ...................... H03M 13/15; H03M 13/29; G11B 20/18
(52) U.S. Cl. ........................ 714/755; 714/769; 714/784
(58) Field of Search ................ 714/755, 769, 714/784

(56) References Cited

U.S. PATENT DOCUMENTS

| | | | |
|---|---|---|---|
| 4,564,945 A | | 1/1986 | Glover et al. .................. 371/38 |
| 4,633,471 A | | 12/1986 | Perera et al. .................. 371/38 |
| 5,285,451 A | * | 2/1994 | Henson et al. ............. 371/11.1 |
| 5,537,567 A | * | 7/1996 | Galbraith et al. ........... 395/441 |
| 5,734,815 A | * | 3/1998 | Schatzberg ............ 395/182.04 |
| 5,875,460 A | * | 2/1999 | Kojima et al. ............... 711/114 |
| 5,901,157 A | | 5/1999 | Hogan ..................... 371/37.01 |
| 6,012,123 A | * | 1/2000 | Pecone et al. ............... 711/114 |
| 6,064,639 A | * | 5/2000 | Sako et al. .................... 369/48 |

* cited by examiner

*Primary Examiner*—Stephen M. Baker
(74) *Attorney, Agent, or Firm*—G. Marlin Knight; Ron Feece (57) ABSTRACT

A method and apparatus for efficiently encoding an ECC block for improving writing performance of a storage device using an ECC block format having a linear code such as a Reed-Solomon code is described. When the data f1 of a part of data sectors among a plurality of data sectors which form an ECC block F1 having a PO portion q1 formed with a linear code such as a Reed-Solomon code is updated with data f2 to obtain the ECC block F2 having the updated PO portion q2, the ECC block F1+F2 of the exclusive OR of the source data part of the ECC block F1 before updating and the ECC block F2 after updating is taken, so that the XOR of f1 and f2 (i.e. f1+f2) of the data f1 to be updated and the updated data f2 is obtained. The XOR of non-updated data sectors is 0. Then, when the ECC block F1+F2 of the XOR is encoded, the PO portion in the form of the XOR q1+q2 is obtained in accordance with the linearity of the Reed-Solomon code. Thus, q2 can be gained based on the exclusive OR of q1+q2 and q1, resulting in the ability to write out the data more efficiently.

12 Claims, 9 Drawing Sheets

ECC BLOCK FORMAT FOR STORAGE DEVICE

BACKGROUND OF THE INVENTION

1. Field of the Invention

The present invention relates to a method and system for efficiently encoding data when the data is written in a storage device and, more particularly to an efficient encoding method of data for devices such as DVDs which have an ECC block format with a linear code ECC code such as a Reed-Solomon code.

2. Description of Related Art

Figure 1:
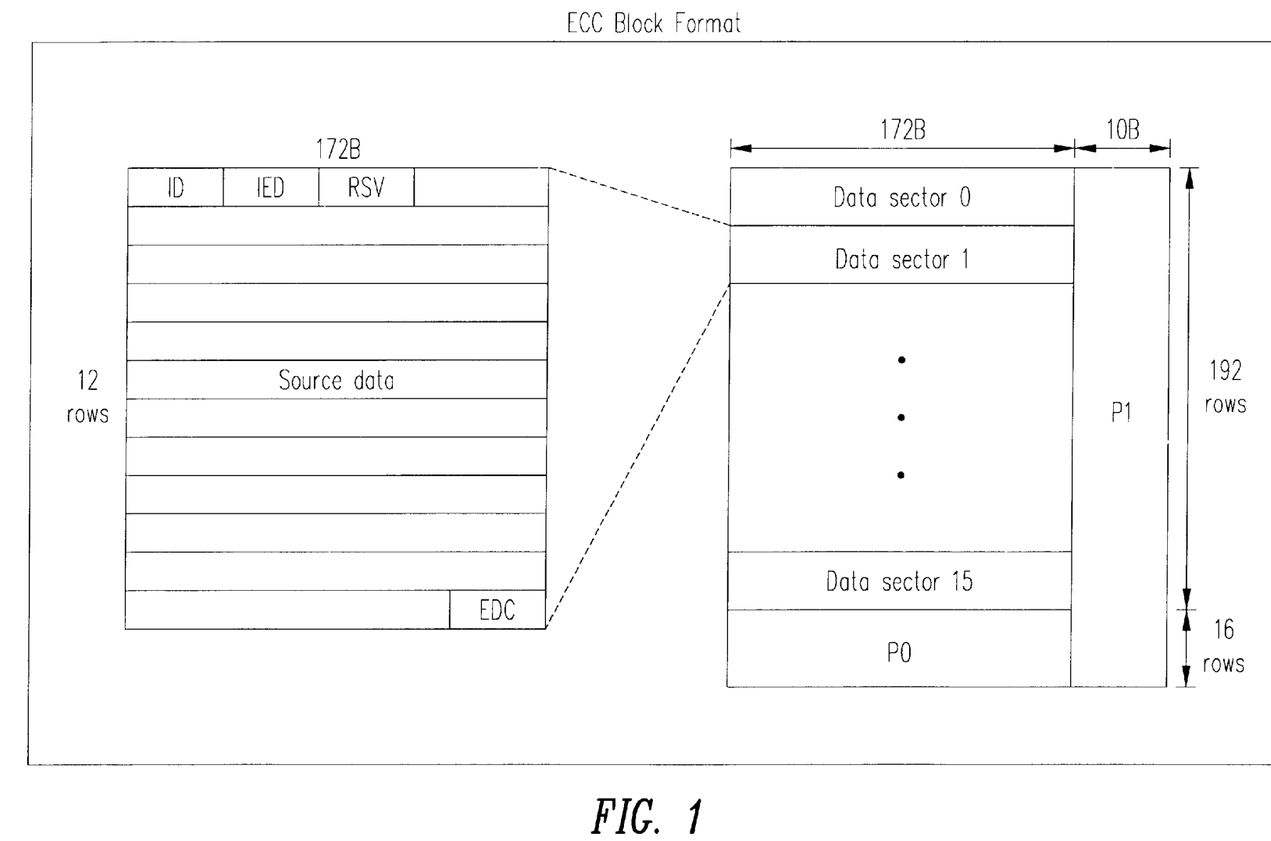
FIG. 1 is a view showing the structure of an ECC block used in a DVD.
Figure 2:
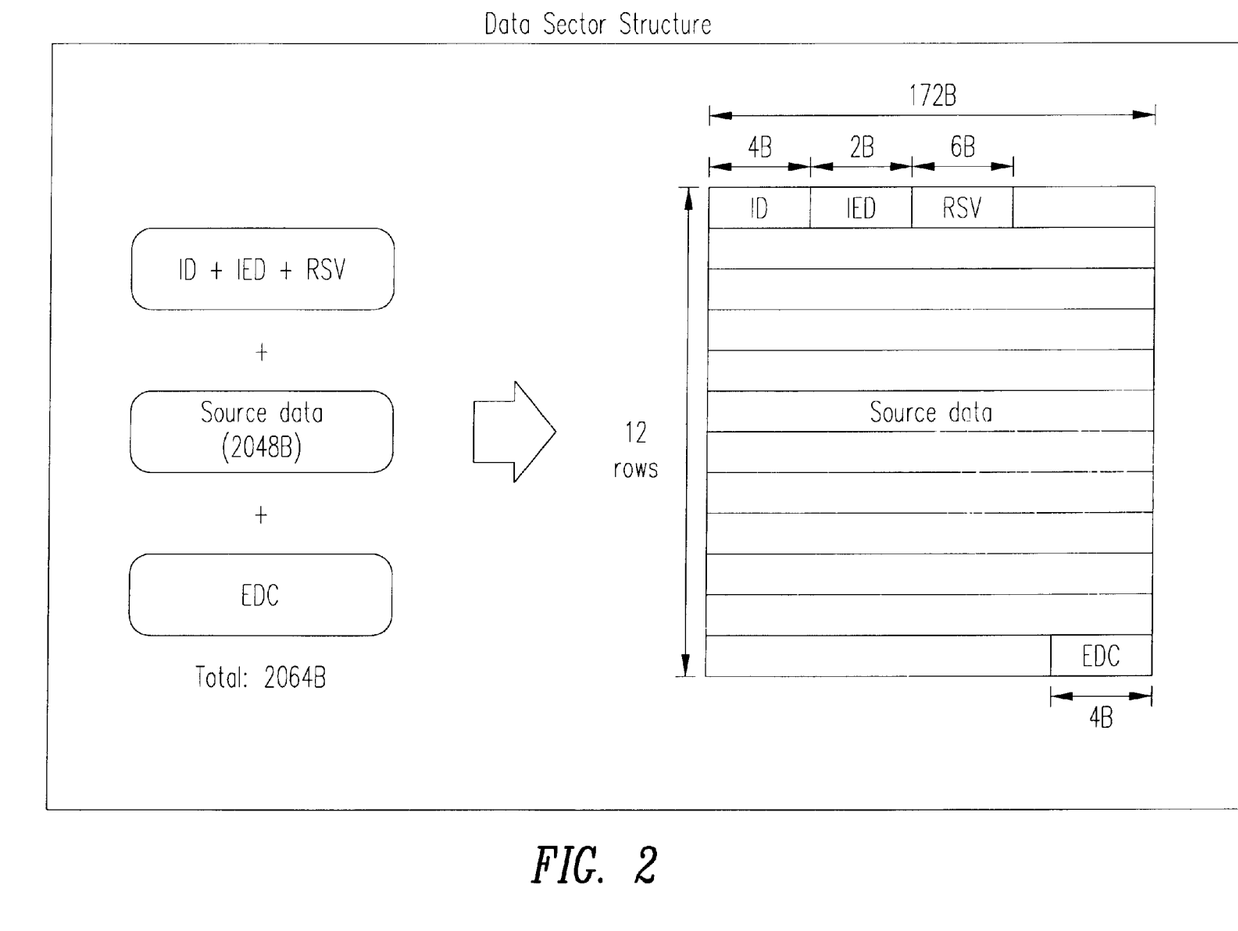
FIG. 2 is a view showing the structure of a data sector used in the DVD.

In the technical field of multimedia, large capacity is needed for storage devices suitable for storing video images as animated picture images, characters and audio information. In order to meet the technical demand related to multimedia, a DVD-ROM has 4.7 GB and a DVD-RAM has 2.6 GB for one layer on a single side. The data structure of the DVD adopts an ECC block format shown in the right side of FIG. 1 to transfer the large capacity of data. The ECC block format includes 16 data sectors each of which has a size of 2064 B. The structure of each data sector is illustrated in FIG. 2. Source data written from a host such as a PC is divided based on a unit of 2 KB. 4 B of ID, 2 B of IED (an error detecting code of ID), 6 B of RSV (reserve) and 4 B of EDC (error detecting code) are added to the respectively divided source data, so that the total of 16 B is added to the source data. Thus, the data structure of 2048+16=2064 B=172 B×12 rows is formed.

In the storage device such as the DVD, a direct writing on a disk is performed by using the 16 data sectors as one group. Thus, an error-correcting codes (ECC) is calculated based on a unit of 32 KB (16×2 KB). As the error-correcting codes, a linear code such as the Reed-Solomon code is utilized. The code using the Reed-Solomon code has a redundancy of about 13% relative to data, so that the large numbers of errors can be corrected. Since methods for encoding the product code from the ECC block by using the Reed-Solomon code is well known, a simple explanation will be given thereto. In encoding the product code from the ECC block, each of byte columns in the vertical direction (column direction) is first encoded. The obtained ECC code of 16 B is provided after a corresponding column. The ECC code is called PO (Parity of Outer: outer code). Then, each of byte rows is encoded relative to the lateral direction (row direction) of the ECC block. The obtained ECC code of 10 B is provided after a corresponding row. The ECC code is called PI (Parity of Inner: inner code). Even if the column direction and the row direction are encoded in a reversed order to that used at an initial time, the result will be the same.

Figure 3:
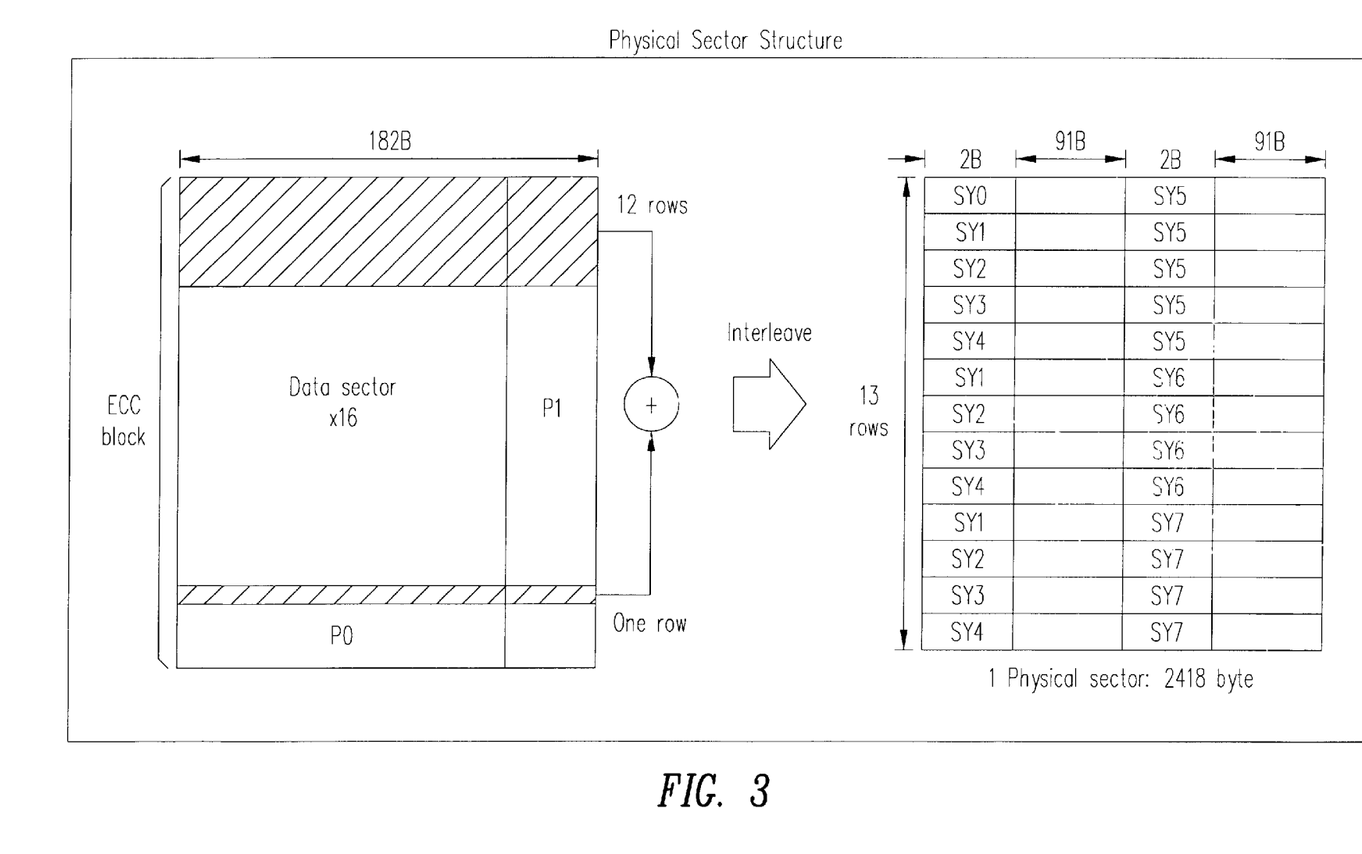
FIG. 3 is a view showing the structure of a physical sector obtained by interleaving the ECC block.

When the ECC block is written on a disk, one ECC block is converted into 16 physical sectors, as is well known. As illustrated in FIG. 3, 12 rows consisting of a data sector part and a PI part and one row of a PO portion in the ECC block are extracted and combined together so that an obtained sub-block becomes the base of one physical sector. In this case, combining 12 rows and one row of the ECC block together to form the sub-block (namely, physical sector) is referred to as interleaving. The sub-block generated by an interleaving operation is equally divided into 26 and a sync code (SY) of two bytes is added to the head of the sub-block. Thus, the physical sector of 2418 B can be obtained. The physical sector subjected to a required modulation processing is sequentially written on the disk 16 times, so that the ECC block 8 of the size of 32 KB is written on the disk.

A storage device such as a hard disk drive (HDD), a phase change type optical disk (for instance, PD), and MO does not employ an ECC block format in which the product code is formed and the length is long. Therefore, even when the source data is written on the disk from a PC side, as the source data is directly encoded or divided into some parts and encoded, the time required for encoding may be small. However, in the DVD, peculiar problems are generated. These problems will be described hereinafter.

Figure 5:
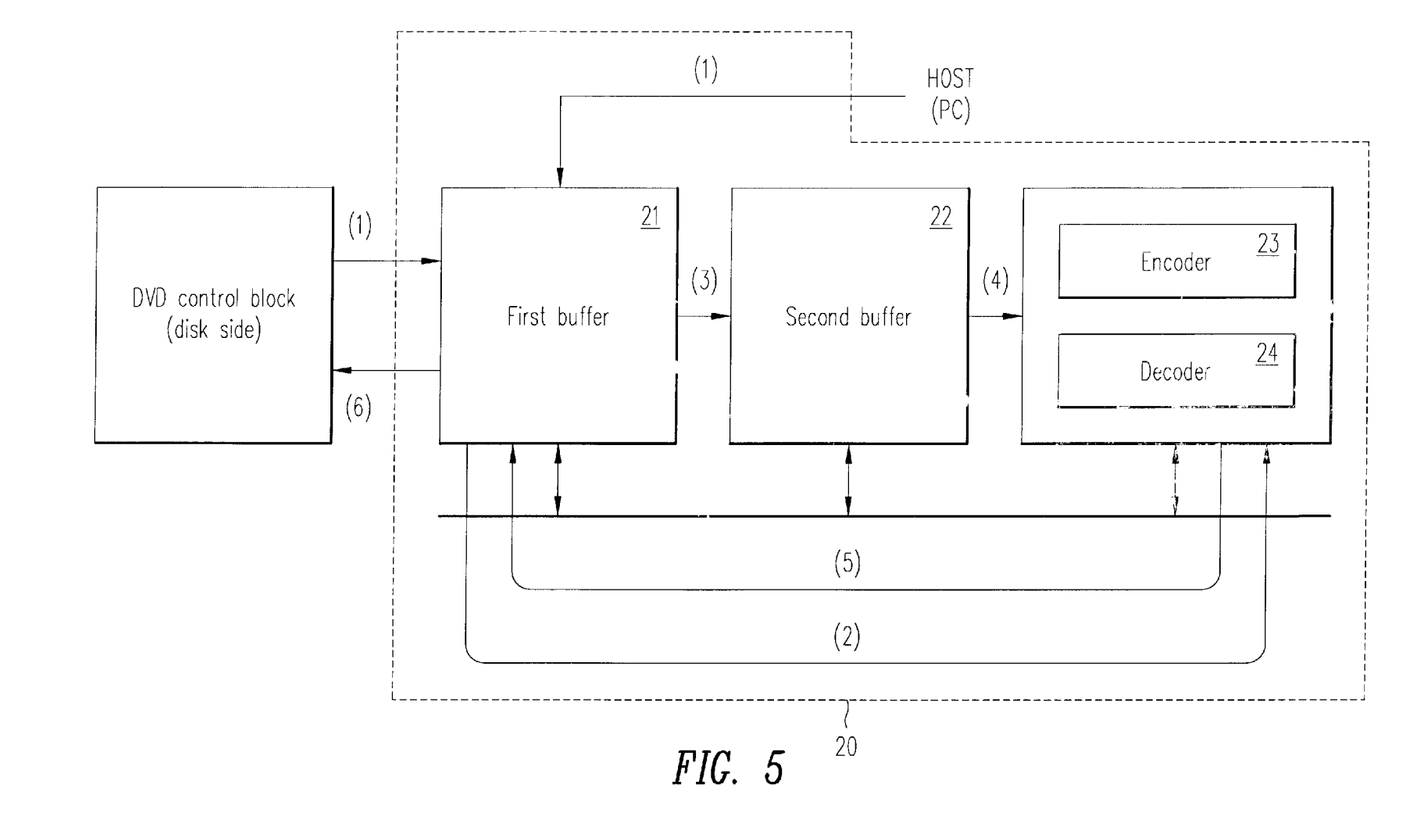
FIG. 5 is a view showing a flow of rewriting the ECC block by one encoding and decoding block 20 as one of the components of FIG. 6.

Referring to FIG. 5, in a disk storage device such as the DVD using the ECC block format, a conventional writing sequence (1) to (6) when the 2 KB data of one data sector of the ECC block is rewritten will be described below.

(1) An encoding and decoding block 20 stores the data of 2 KB sent from a host in a first buffer 21. At the same time, the encoding and decoding block reads an ECC block on which the 2 KB data is to be written from a disk side and stores it in the first buffer 21.

(2) If the data read from the ECC block has an error, the error is corrected by an ECC decoder 24.

(3) In the first buffer 21, the corresponding data sector of the ECC block stored in the first buffer 21 is rewritten with the 2 KB data from the host.

The rewritten ECC block is transferred to a second buffer 22.

(4) The source data of the changed ECC block is sequentially sent to an encoder 23 from the second buffer 22, so that the PO portion of the ECC block is calculated.

(5) The calculated result of the PO portion is-sent to the first buffer 21 to rewrite the PO portion, so that the updated and complete ECC block is stored in the first buffer 21.

(6) This ECC block is written on the disk.

In practice, in (1), the data of the physical sector is read from the disk, and converted into ECC block data in the first buffer 21. In (6), the ECC block data is converted into the physical sector data and written in the disk.

According to such a conventional writing sequence, in (4), all bytes of columns must be transferred to the encoder 23 one by one. In (5), PO portions for all columns need to be calculated and the values of all PO portions cannot be written until they are obtained. Specifically, since the DVD utilizes the ECC block format, even when the source data of 2 KB for one data sector is written from the PC side, the ECC code using the Reed-Solomon code for all the ECC block having the size or capacity of 32 KB must be calculated again. Therefore, although it is necessary to write only the new data of 2 KB, it takes long time to encode the ECC block, so that writing efficiency is undesirably deteriorated. There may be possibly encountered a situation that when the calculating processing of the PO portions is not completed within a time until the disk rotates once and returns to the head of the same ECC block on the disk after one ECC block is read, a user must wait for the disk further rotating once. Particularly, in the case of a CLV (Constant Linear Velocity) system (for example, it takes time of 12.5 ms (inner periphery) to 29.6 ms (outer periphery)to rotate once on the track of a disk with small radius, for instance, at two times speed in the DVD), writing or updating performance has been significantly deteriorated.

SUMMARY OF THE INVENTION

Accordingly, it is an object of the present invention to provide a method and a system for efficiently encoding an ECC block and a rewritable DVD system to which the method is applied in order to improve a writing performance to a storage device using an ECC block format.

It is another object of the present invention to realize a new method for writing an ECC block on a disk before a processing related to an ECC is completed and improve a performance upon writing of the ECC block by using the linearity of a linear code such as a Reed-Solomon code.

The present invention was made by finding that processing when the data is written on a disk can be made more efficient by employing the linearity of a linear code such as a Reed-Solomon code. In the above described step (4), all the data (172 columns) of the ECC block are not encoded nor the PO portions of the ECC are formed. The PO portion is formed by considering only one or a plurality of data sectors which are updated.

The present invention provides a method for efficiently encoding the PO portion q2 of an updated ECC block F2 when updating the data f1 of a part of data sectors among a plurality of data sectors which form an ECC block F1 having an ECC code PO portion q1 formed with a linear code such as a Reed-Solomon code, with data f2. This method comprises a step of assuming an ECC block F1+F2 ("+" is used to mean an XOR computation, hereinafter) representing the XOR computation of the source data part of the ECC block F1 before updating and the ECC block F2 after updating, in which the data of the updated part of the data sectors is given by the XOR computation f1+f2 of the data f1 and the data f2 and it is assumed that the data of non-updated data sectors is 0; a step of obtaining the PO portion q1+q2 of the ECC block F1+F2 including a step of encoding the data f1+f2 of the updated part of the data sectors for each byte by an encoder and a step of encoding the data 0 of non-updated data sectors for each plurality of bytes by an encoder; and a step of obtaining the PO portion q2 of the updated ECC block F2 by carrying out the XOR computation of the PO portion q1+q2 of the ECC block F1+F2 and the PO portion q1 of the ECC block F1 before updating. The present invention further provides a system to which the method is applied and a rewritable DVD system to which the method is applied.

DETAILED DESCRIPTION OF THE PREFERRED EMBODIMENT

Figure 6:
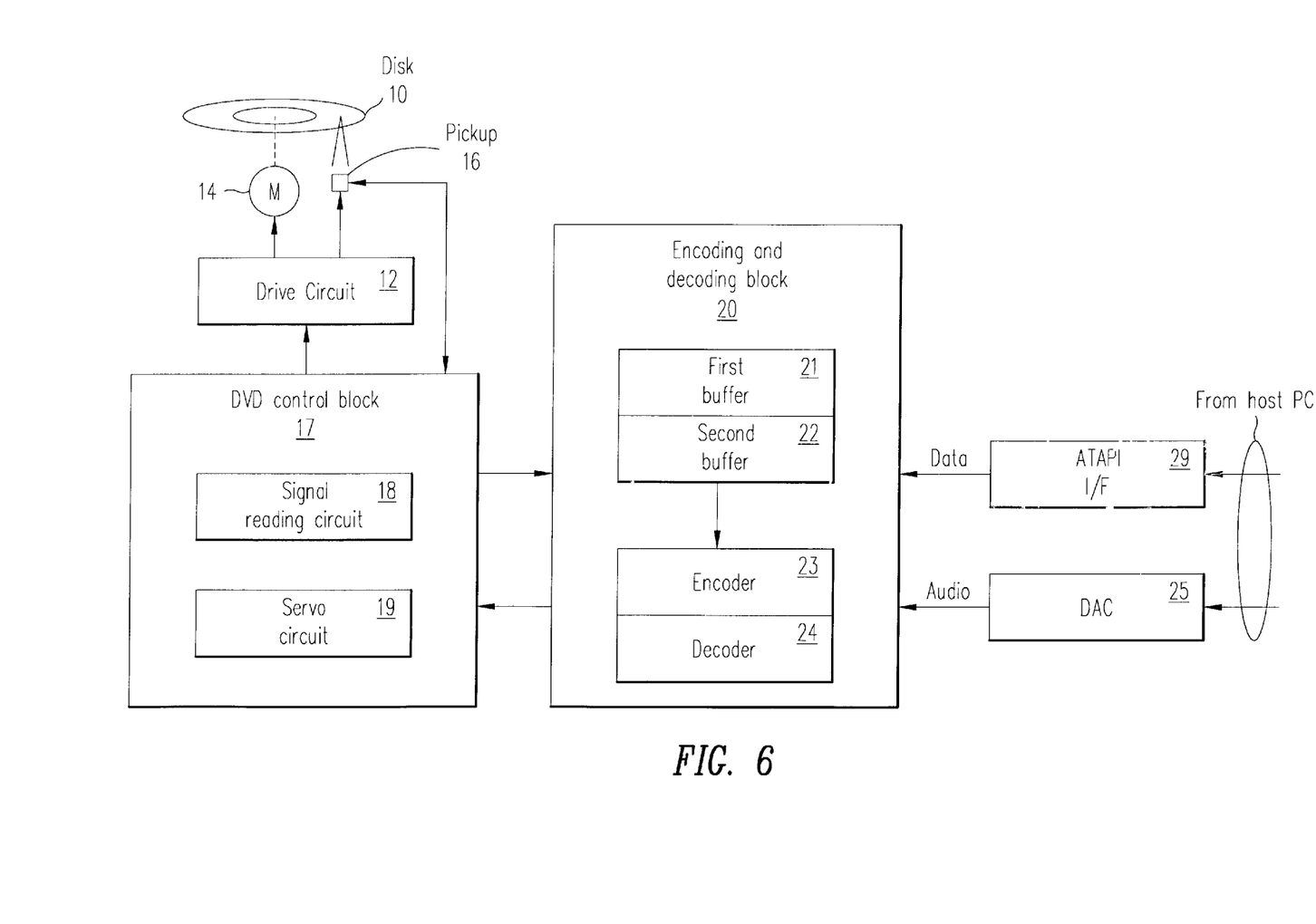
FIG. 6 is a view showing the configuration of a writable DVD recording and reproducing system applied to the encoding method of the present invention.

FIG. 6 shows an embodiment of a DVD recording and reproducing system to which the present invention is applied. A disk 10 is rotated by a motor 14 connected to a drive circuit 12. Data recorded in the disk 10 is read by an optical pickup 16. The drive circuit 12 operates in accordance with a command from a DVD control block 17. A signal read by the pickup 16 from the disk is inputted to the DVD control block 17, amplified by a signal reading circuit 18, undergoes a necessary conversion and sent to an encoding and decoding block 20. The DVD control block 17 includes a servo circuit 19 for controlling the drive circuit 12 based on servo data recorded in the disk.

The encoding and decoding block 20 is connected to a host PC which sends new data. Video data is supplied to the encoding and decoding block 20 through an ATAPI interface (ATA packet interface) 29 from the host PC. Audio data is supplied to the encoding and decoding block 20 through a DAC (digital/analog converter) 25 from the host PC. The data read from the disk is stored in a first buffer 21 and any errors therein are corrected in real time by a decoder 24. The decoder 24 detects any errors in the ECC block of the read data stored in the first buffer 21 for each of byte columns including a PO portion and encodes correct data. The first buffer 21 is loaded with data sent from the host PC. An encoder 23 encodes an ECC block including the data supplied to the buffer 21 for each of byte columns and encodes the PO portion. As a standard embodiment of the present invention, it is assumed that the source data of 2 KB of one data sector is written on the disk from the host PC. This embodiment simply designates an example. Therefore, the present invention may include an example that the data of two or more data sectors is written on the disk.

According to the present invention, the linearity of a Reed-Solomon code is utilized in forming the ECC (for example, a PO portion) when one data sector of source data is rewritten in a storage device such as a DVD using an ECC block format. More specifically, all the PO portion of the ECC block is efficiently encoded by taking only the data sector of 2 KB written from the PC side into consideration.

Figure 7:
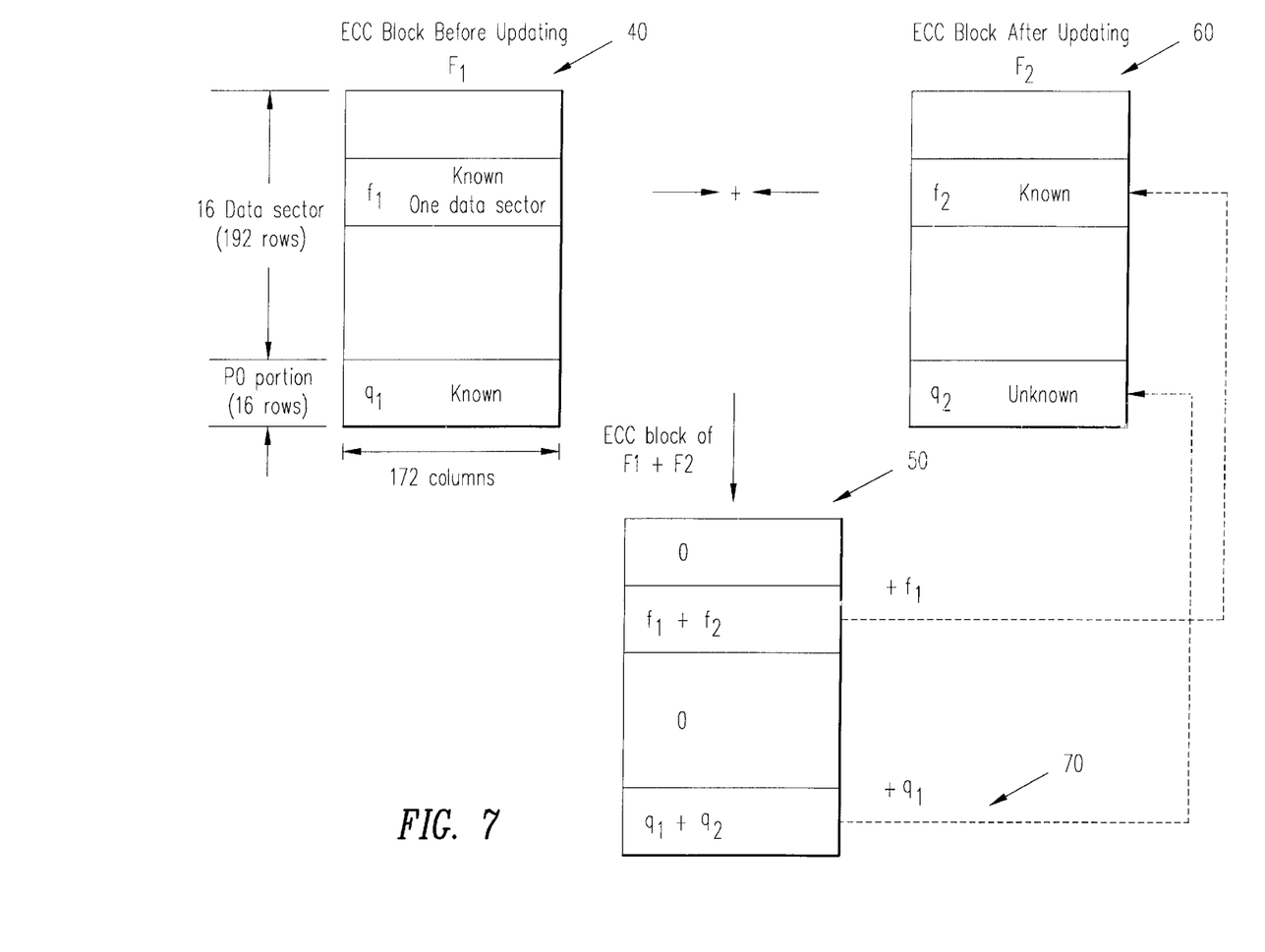
FIG. 7 is a view showing the processing procedure of the encoding method of the present invention using the linearity of a Reed-Solomon code.

FIG. 7 shows the data flow for obtaining the new PO portion of the ECC block one data sector of which is rewritten (updated) by utilizing the linearity of the Reed-Solomon code. A list of definitions used in the data flow will be described below.

| | |
|---|---|
| +: | XOR (exclusive OR) computation |
| F1: | ECC block before updating |
| F2: | ECC block after updating |
| f1: | data of one data sector before updating |
| f2: | data of one data sector after updating |
| q1: | data of PO portion before updating |
| q2: | data of PO portion after updating |
| f1 + f2: | XOR computation of data of one data sector before and after updating |
| q1 + q2: | XOR computation of data of PO portion before and after updating |
| F1 + F2: | ECC block after XOR computation of f1 + f2 |

In FIG. 7, the PI part of the Reed-Solomon product code of the ECC block format (FIG. 1) is omitted to simplify the explanation.

The ECC block F1 to be updated has been already encoded by using the Reed-Solomon code. This encoding processing is performed as described below. A byte column (a column of 192 bytes formed by taking one byte from each of 192 rows) is read from the source data of the ECC block F1, the data of 192 B is sent to the encoder 23, and the encoding processing is performed so that 16 B of the PO portion of the byte column is obtained. The encoding processing of the 13 byte column is performed for all of 172 byte columns, so that all of the PO portion for 16 rows can be calculated and the PO portion q1 of the ECC block F1 can be obtained (see 40 in FIG. 7). When the data f1 of the selected data sector of the ECC block F1 is rewritten by new data f2, an updated ECC block F2 has been conventionally prepared and the above described encoding processing has been performed for all byte columns of the source data of the ECC block F2 to get q2 of a PO portion.

The present invention is based on a knowledge that the XOR computation of the source data of the ECC block F1 to be updated and the source data of the updated ECC block F2 is taken, and the gained result is encoded with the Reed-Solomon code to obtain the PO portion, so that data corresponding to q1+q2 can be obtained in the PO portion (see 50 in FIG. 7). When q1+q2 is obtained, the XOR computation of q1+q2 and q1 is taken (see 70 in FIG. 7), so that q2 can be obtained (see 60 in FIG. 7). The XOR computation is performed for each unit of corresponding data (each byte in this example).

Element 50 in FIG. 7 represents the result obtained in accordance with the processing of the present invention. In this ECC block, the one data sector after updating has the XOR computation f1+f2. The data f1+f2 is not completely 0 based on each of bytes. On the other hand, the remaining 15-data sectors of the ECC block F1+F2 are all 0, because corresponding data does not change. Further, when the byte columns of the source data part of the ECC block F1+F2 are subjected to an encoding processing with the Reed-Solomon code, data corresponding to q1+q2 is obtained in the PO portion. As shown by a dotted line 70 for connecting the PO portions in 50 and 60 of FIG. 7 together, when the XOR computation of a known value q1 is applied to the PO portion q1+q2 of the ECC block F1+F2, the PO portion q2 of the updated ECC block F2 can be ensured. A phenomenon that the PO portion obtained by encoding the source data of the ECC block F1+F2 represents the XOR 14 computation of the PO portions q1 and q2 of the ECC blocks Fi and F2 is related to the linearity of the Reed-Solomon code.

The feature of the processing of the present invention resides in that the writing operation of the updated ECC block can be started earlier. This can be done mainly because of a combination of actions mentioned below. One of the reasons is that the data of the ECC block can begin to be written as soon as q1+q2 is obtained, and therefore, it is not necessary to delay the writing operation until all the data of q2 is obtained, Specifically, when q1+q2 is determined q2 is sequentially obtained for each of byte rows of the PO portion based on the XOR computation of (q1+q2) and (q1) and one data sector can be written in accordance with the above mentioned interleaving operation, every time q2 of one byte row is obtained. A second reason is that since the XOR computation of the data of non-updated data sectors are all 0, the XOR computation of these non-updated data sectors does not actually need to be performed and zero is internally generated in the encoder 23 so that the Reed-Solomon encoding processing can be efficiently performed. Accordingly, q1+q2 can be rapidly generated and a writing start time can be made faster.

Figure 8:
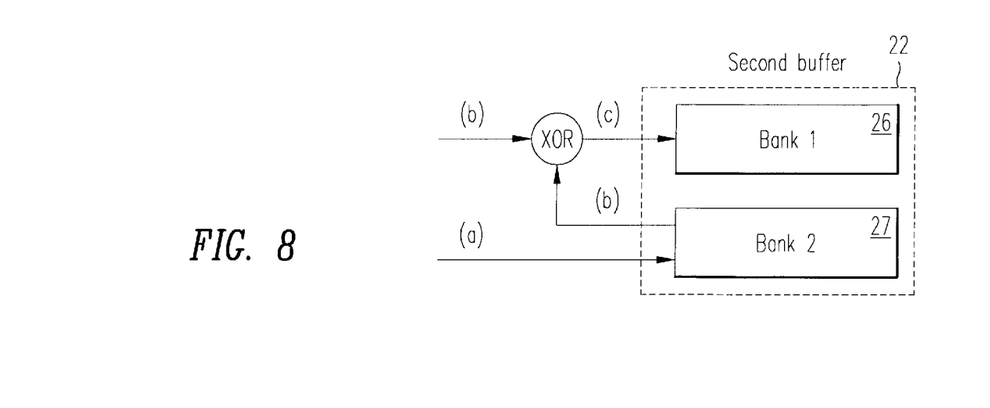
FIG. 8 is a view showing a processing procedure for maintaining the XOR computation result of the original data of a data sector to be updated and new data by using two banks constituting a second buffer.

Now, referring to FIGS. 6 and 8, the processes of the present invention will be described in detail. The first buffer 21 comprises a DRAM. The second buffer "22" comprises a SRAM to transfer data at high speed between the second buffer and the encoder 23 or the decoder 24. As shown in FIG. 8, according to the present invention, the second buffer 22 consists of two banks 26 and 27 of the SRAM. The encoder 23 sequentially inputs the data of 192 bytes for one byte column to form and output the PO portion of 16 bytes. When the one byte column is encoded, the data can be inputted to the encoder 23 for each unit of byte or a plurality of bytes.

Figure 9:
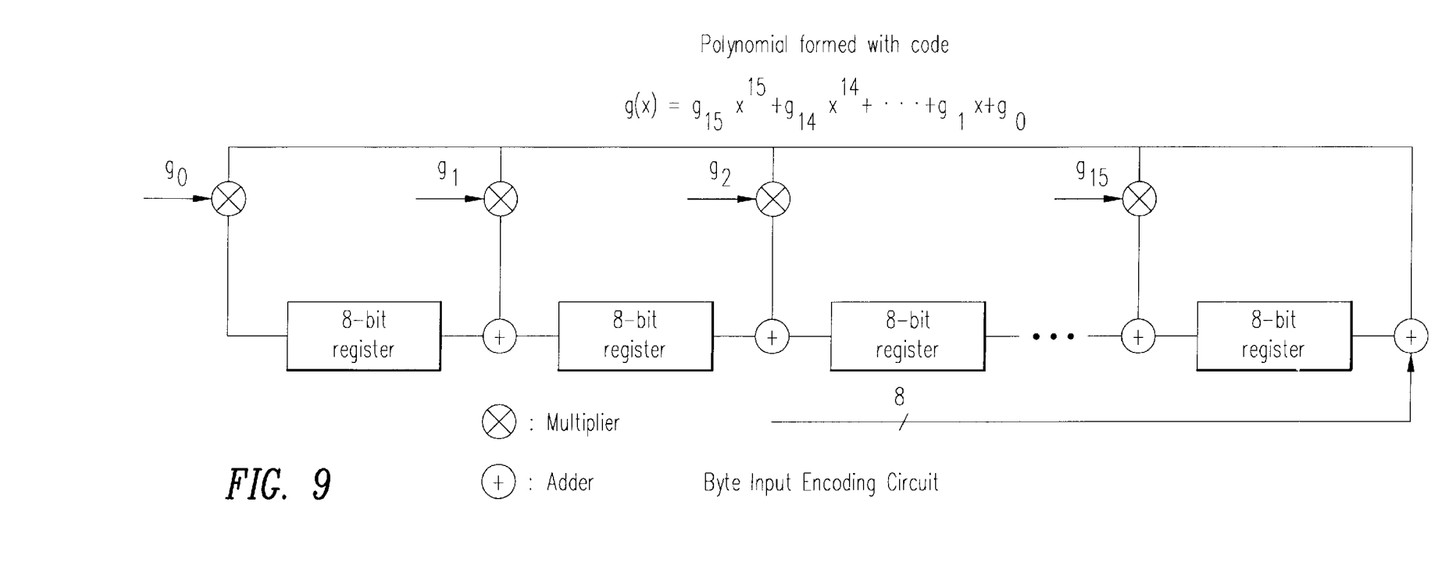
FIG. 9 shows a byte input encoding circuit when an encoding circuit 23 is in a byte input mode.
Figure 10:
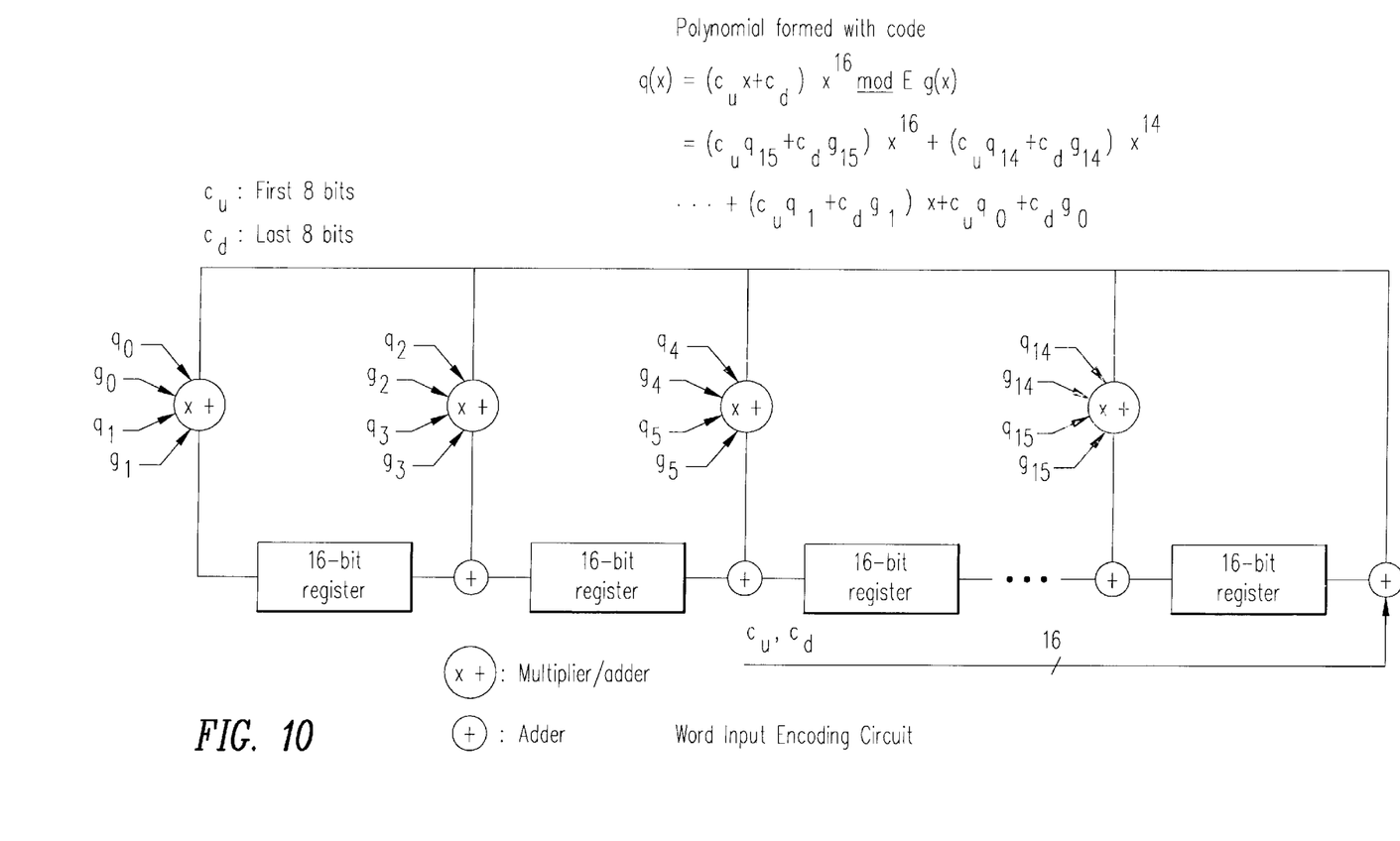
FIG. 10 shows the byte input encoding circuit when the encoding circuit 23 is in a word input mode.

Now, an explanation is given to the use of the encoder 23 which can be switched between a byte input mode and a word (two bytes) input mode in this embodiment. FIGS. 9 and 10 respectively show encoding circuits when the encoder 23 is switched to the byte (8 bits) input mode and when the encoder 23 is switched to the word (16 bits) input mode. In the byte input encoding circuit, an input is performed based on a unit of 8 bits and 192 B of one byte column are sequentially input. The byte column data are sequentially multiplied by respective coefficients g0 to g15 shown in the drawing in each of 16 multipliers so that the computation of a polynomial formed with the Reed-Solomon code is executed. When the input of all 192 B is finished, 16 B of the PO portion is formed in 16 8-bit registers. In the word input encoding circuit, an input is performed based on a unit of 16 bits (two bytes in the direction of column) and 192 B of one byte column are sequentially inputted. The inputted word column is sequentially multiplied by various kinds of coefficients shown in the drawing in each of 8 multipliers/adders so that the computation of a polyminal formed with the Reed-Solomon code is executed. Then, when the input of all 192 B is completed, 16 B (8×2 B) of the PO portion is formed in 8 16-bit registers. Parenthetically, the byte input encoding circuit and the word input encoding circuit may be independently provided, or the 8-bit registers may be internally configured in the 8 16-bit registers and shared.

When the one data sector of the ECC block is updated, a data sector to be updated is first sent to the first buffer 21 from the host, and the ECC block consisting of 16 data sectors including this data sector is read to the first buffer 21 from the disk.

Then, the encoding processing of the present invention will be performed as mentioned below for assuring the XOR computation f1+f2.

[1] The XOR computation f1+f2 for the new data f2 of the one data sector to be rewritten and the original data f1 of the ECC block is stored in the second buffer 22 in accordance with the following procedure.
  (a) 12 byte rows of the original data f1 of the one data sector to be rewritten which is stored in the first buffer 21 are sent to the bank 27.
  (b) 12 byte rows of the new data f2 stored in the first buffer 21 are sent to the second buffer 22 and the 12 byte rows of the original data f1 which are stored in the bank 27 are read at the same time.
  (c) The XOR computation of both data is performed in an MPU (not shown) and the result f1+f2 is stored in the bank 26.

[2] When the data of the bank 26 is encoded, the encoder 23 is set to the byte input mode. Then, one byte of one byte row is taken out from the bank 26 and the byte is used as the byte input of the encoder 23 (see FIG. 9).

[3] The data of 15 remaining data sectors of the ECC block F1+F2 is 0 for all 180 byte rows, since the data of these data sectors is not changed.

The processes (a) to (c) of [1] do not need to be performed for 180 byte rows of the data sectors. In this case, the input mode of the encoder 23 is switched from the byte input of [2] to the word input and the word data of the input is regarded as 0, all zero data is generated in the encoder 23, and an encoding processing is performed based on a unit of word (namely, two bytes in the direction of column) (see two byte input $C_u$, $C_d$ in FIG. 10). The encoding operation can be performed based on a unit of word because the all zero data can be internally generated. The bank 26 as the SRAM cannot simultaneously make access to a plurality of bytes in the direction of column owing to the limitation of an address system. Accordingly, the data sector to be updated of the bank 26 needs to be encoded under the byte input mode.

[4] The processes [2] and [3] are performed for all byte columns, so that the PO portion of the ECC block F1+F2 is given as the XOR computation q1+q2 of the PO portion q1 of the ECC block F1 to be updated and the PO portion q2 of the updated ECC block F2. 12 byte rows of the PO portion q1+q2 is stored in the first buffer 21.

[5] When the XOR computation of the PO portion q1 of the ECC block F1 to be updated is performed relative to 172 B of one byte row of the XOR computation q1+q2 of the PO portion of the ECC block F1+F2, as shown by the dotted line in FIG. 7, one row of the true PO portion q2 of the ECC block F2 rewritten with the data f2 can be obtained based on the linearity of the Reed-Solomon code. The processing shown by the dotted line in FIG. 7 is sequentially performed for all of 16 byte rows of the PO portion, so that all (16 byte rows) of the PO portion q2 of the ECC block F2 rewritten with the data f2 can be ensured. When the one byte row of the true PO portion q2 of the updated ECC block F2 is obtained, the 12 byte rows of the source data of the ECC block can be combined with the one byte row of the PO portion and sequentially interleaved and sent to the disk side.

According to the encoding method of the present invention, a part in which the input to the encoder 23 can be regarded as 0 in the processing (3) does not depend on data transfer speed from an external part. A part in which the input to the encoder 23 is regarded as 0 does not actually input data to the encoder 23 and encodes data based on a unit of word. According to this encoding method, the calculating speed of the encoder 23 can be substantially enhanced by changing the mode of the encoder 23 to the word input from the byte input. Therefore, according to the encoding method of the present invention, the one byte row of the PO portion can be desirably effectively ensured more rapidly than the conventional method by which an encoding operation must be done for each byte relative to all of 192 bytes in the direction of byte columns of 16 data sectors of the ECC block. The 12 byte rows of the source data of the ECC block shown in FIG. 3 are combined with the one byte row of the PO portion and interleaved at an early time, so that the writing performance of the disk side is improved. As described in the embodiment, although the part in which the input to the encoder can be regarded as 0 is processed based on a unit of word (two bytes), the part may be processed based on a unit larger than the word so as to further improve the calculating speed in the encoding of the ECC block. Further, a plurality of the same encoders 23 can be provided so that a plurality of byte columns can be encoded in parallel.

The processing time actually required for the above mentioned processes [1] to [5] are calculated based on values used in the data flow architecture of the optical disk controller of a DVD-RAM as shown in Table 1.

TABLE 1

|  | [Row] | [Column] | [C/B] or [1/B] | [Times] |  |  |
|---|---|---|---|---|---|---|
| [1] | 12 × | 172 | × 1/32" | × 2 | × 1.34 [μS/C] | = 173 |
| [2] | 12 × | 172 | × 1 |  | × 50 [nS] | = 103 |
| [3] | 180 × | 172 | × 1 | × ½ | × 50 [nS] | = 387 |
| [4] |  | 172 | × 1 |  | × 1.5 [μS] | = 258 |
| [5] | 16 × | 172 | × ½" | × 2 | × 0.84 [μS] | = 2312 |
| Total |  |  |  |  |  | 3231 [μs] |

[C] means a cycle and the unit of the values in positions of " represents [C/B].

In the processing [1], assuming that a DRAM bus cycle is 1.34 μS and an encoding in the cycle requires transfers of 32 B (1/32cycles are occupied for 1 B), time for transferring the original f1 of the one data sector to be updated of the ECC block to the bank 27 of the first buffer 22 (SRAM) from the first buffer (DRAM) is expressed by 12×172×1/32[cycle/B] ×1.34=86.4 μS. Similarly, assuming that a DRAM bus cycle is 1.34 μS and an encoding in the cycle requires transfers of 32 B (1/32cycles are occupied for 1 B), time for reading the new data f2 sent to the first buffer 21 from the host and performing the XOR computation of the data f1 read from the bank 27 of the second buffer 22 therewith and transferring the obtained result to the bank 26 of the second buffer 22 is also expressed by 12×172×1/32[cycle/B] ×1.34=86.4 μS. The time of the processing [1] in the Table 1 indicates the total of both time. Assuming that access time to the second buffer 22 (SRAM) is 50 nS, [2] indicates time for transferring the data of 12 byte rows of the second buffer (bank 26) to the byte input encoder 23 by reading 1 B at one access.

Assuming that the operating clock of the encoder 23 is 50 nS, [3] indicates time for regarding non-updated data 180 B as 0, switching the encoder 23 from the byte input to the word input (two byte input) for all 0 thereof and internally encoding the data. The calculation of the PO portion for the ECC block F1+F2 including one data sector f1+f2 is completed in accordance with the processes [2] and [3], so that q1+q2 is maintained. Since the computation of the original PO portion q1 of the first buffer 21 to the PO portion q1+q2 can be performed and the result can be written and returned to the first buffer 21, it may be regarded that the preparation of the PO portion q2 of 172 byte rows is substantially completed when the processing of [3] is finished after other processes.

Assuming that time required for an MPU to read 16 B of one byte row of the PO portion q1+q2 to a working area from the output of the encoder 23 is 1.5 μS, [4] represents time required for reading the PO portion of all 172 byte rows.

[5] represents the total of time required for the MPU to read the PO portion q1 of the original ECC block F1 to the working area from the first buffer 21 (DRAM), carry out the XOR computation of the PO portion q1+q2 of the ECC block F1+F2 including data f1+f2 therewith and write and return the true PO portion q2 (see the processing shown by the dotted line 70 in FIG. 7) to the first buffer 21. In this calculation, it is assumed that the DRAM bus cycle is 0.84 μS (It is smaller than the DRAM bus cycle 1.34 μS in the processing [1] because the MPU does not need to transfer the source data of the ECC block to the second buffer 22 (SRAM) in the processing [5], so that the bus cycle can be made the faster) and the MPU can read and write the data in that cycle based on a unit of 2 B (½ cycles are occupied for 1 B). The true PO portion q2 is formed for each byte row and all of 16 byte rows can be finally ensured. The PO portion of 172 B of one byte row is stored in the DRAM of the first buffer 21, combined with 12 byte rows of the source data part and interleaved as shown in FIG. 3.

Figure 4:
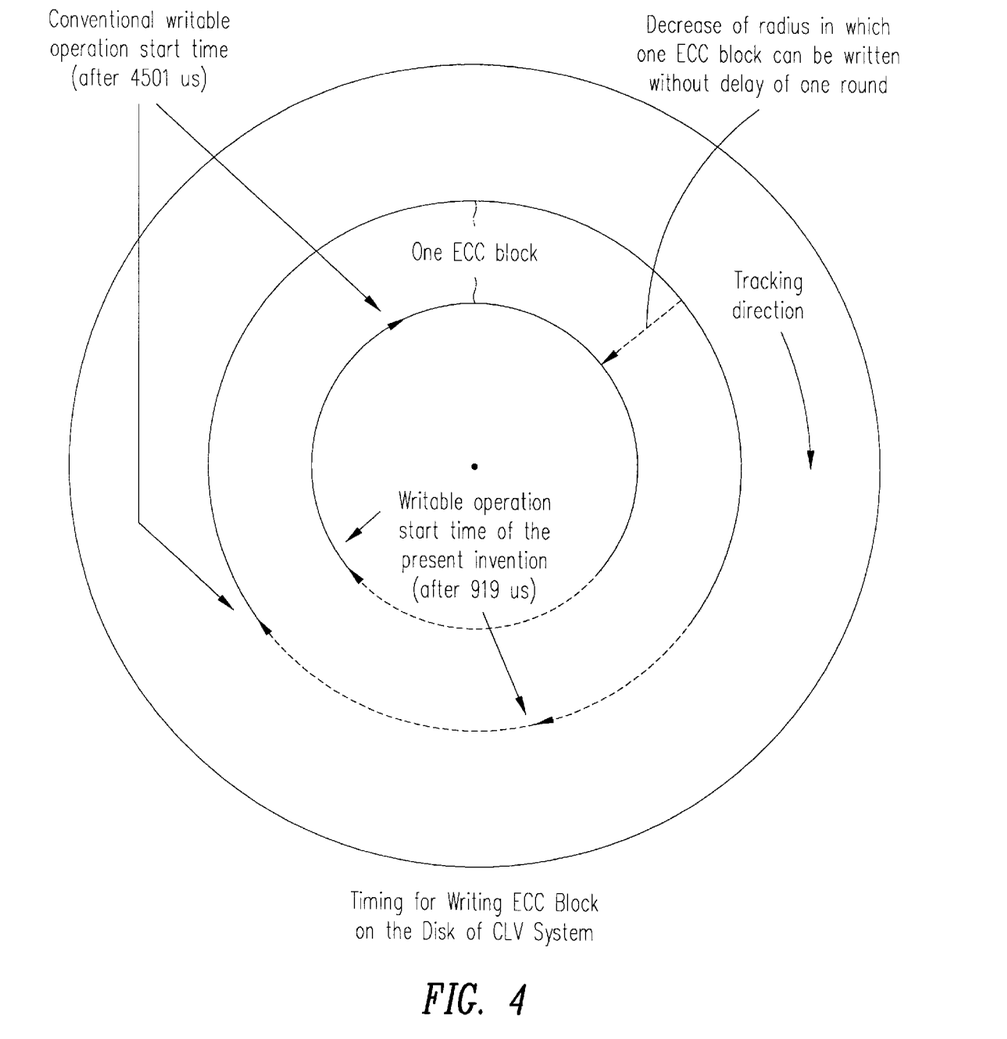
FIG. 4 is a view showing the writable operation start time of the ECC block on the disk of a CLV system and that a radius in which the ECC block can begin to be written when the disk rotates once is more decreased than that in a 23 conventional method.

As illustrated in FIG. 4, when conditions such as the DRAM bus cycle are the same as those of the above described calculations, time required until the calculation of the PO portion of the updated ECC block F2 is completed after one ECC block is read was about 4501 μs in the conventional encoding method. On the other hand, the total of time required for the processes [1] to [5] in the embodiment of the encoding method according to the present invention is 3231 μS, which seems to have no large difference from the conventional method. However, since the encoding method of the present invention is rapid in timing to start a writing operation, the present invention is more advantageous than the conventional method. According to the present invention, when the processing [4] is completed, all the calculation of the PO portion q1+q2 of the ECC has been already completed and the transfer of the data of result can be started. When the XOR computation of byte rows of the PO portion q1 of the ECC block F1 before updating is performed relative to one byte row of the PO portion q1+q2 of the ECC block F1+F2 given by the processing of [4] through the processing of [5], one byte row of the PO portion q2 of the ECC block F2 after updating can be obtained. When the one byte row of the PO portion q2 is obtained, the PO portion q2 of one row and the 12 byte rows of the source data part can be interleaved (see FIG. 3) and sent to the disk side. Specifically stated, the writable operation start time of the ECC block according to the method of the present invention is approximately 919 μS (the total of the processing time of [1] to [4]) after the ECC block is read (after the processing of the PO portion is started). In the conventional method, when 4501 μS required for processing all of 16 byte rows of the PO portion does not 21 pass, the writing operation of the ECC block after updating cannot be started. On the contrary, according to the method of the present invention, the writing performance is more improved.

According to the DVD technique in the case of two times speed in the CLV (Constant Linear Velocity) system, as the radius of a disk becomes smaller, rotating speed is increased (It takes time of 12.5 ms (inner periphery) to 29.6 ms (outer periphery) to rotate once on the disk). Therefore, as a track goes to the inner part of the disk, time used for updating is decreased. If the radius of the track is smaller than a critical radius, in other words, a minimum radius in which a prescribed updating processing is completed within a time until the disk rotates once and returns to the position of the head of the ECC block to enter a writing operation, the updating processing cannot be done while the disk rotates once so that time is further required for waiting for one rotation of the disk. The outside track shown in FIG. 4 indicates the critical radius in the conventional method. According to the present invention, since the writing operation can be started at an early timing after 919 μS necessary for preparing the PO portion, the critical radius can be decreased as illustrated by an inside track in FIG. 4. When the ECC block in the inside track is rewritten by employing the conventional method, it is necessary to wait for the disk to further rotate once because the writing operation can be only performed within the ECC block.

According to the present invention, the radius in which the delay of one round is generated when the ECC block is written by updating the data sector can be reduced relatively by 16% in the CLV system in accordance with the calculation described below. According to the present invention, the writing operation start time ([1] to [4]) 919 us of the present invention is subtracted from the processing time 4501 us of the PO portion of the conventional method so 22 that the writing operation can be performed about 3.58 ms faster than the conventional method. A radial area in which the writing operation can be performed without the delay of one round owing to the interleaving operation at an earlier time is increased relative to total radius by 3.58 ms/(29.6 ms−12.5 ms)=about 21%.

Although the ECC block using the Reed-Solomon code is explained in the embodiment, it is to be understood that the present invention may be applied to an ECC block using other linear codes having a similar linearity such as a Hamming code, a BCH code or a Fire code.

As mentioned above, according to the present invention, a new encoding processing method, by which the data can be written on the disk before the processes related to the ECC are completed by using the linearity of the linear code such as the Reed-Solomon code in the storage device having the ECC block or the like, can be realized and a performance in writing data can be improved.

We claim:

1. A method of encoding an updated ECC block linear code PO portion q2 of an updated ECC block F2 containing a plurality of data sectors, for replacing data f1 of an ECC block F1 with updated data f2 based upon an update difference ECC block (F1 XOR F2) having updated difference data (f1 XOR f2) corresponding to the updated data part and having 0 data corresponding to the remaining part, wherein the data f1 is at least part of one of the plurality of data sectors in the ECC block F1, the method comprising:

obtaining an update difference PO portion (q1 XOR q2) of the update difference ECC block (F1 XOR F20, including a step of applying to an encoder the update difference data (f1 XOR f2) in single byte units and encoding 0 data of each byte of the remaining data part in plural-byte units; and obtaining the PO portion q2 by XOR combining of the PO portion (q1 XOR q2) and the PO portion q1.

2. The method according to claim 1, wherein the plurality of bytes indicate a word or a double word and data 0 is internally generated and encoded by an encoder for non-updated data sectors.

3. The method according to claim 1, wherein the step of obtaining the PO portion q2 of the updated ECC block F2 comprises:

carrying out the XOR computation of the PO portion q1 to the PO portion q1+q2 for each byte row; and interleaving one byte row of the PO portion q2 and the prescribed number of byte rows of the source data part of the ECC block F2 every time one byte row of the PO portion q2 is obtained.

4. The method according to claim 1, wherein the ECC block comprises 16 data sectors, at least one data sector is rewritten and the linear code is a Reed-Solomon code.

5. The method according to claim 4, wherein the data sector comprises 12 byte rows×172 byte columns, the source data of the ECC block comprises 192 byte rows×172 byte columns and the PO portion for each byte column has 16 bytes.

6. The method according to claim 1, wherein in the step of obtaining the PO portion q1+q2, the input of the encoder is switchable so as to be supplied in single byte units or in plural byte units.

7. The method according to claim 6, wherein in the step of obtaining the PO portion q1+q2, two encoders are used and the two bytes of the ECC block F1+F2 are encoded in parallel.

8. A method for encoding a PO portion of an ECC block using a Reed-Solomon code, when the ECC block is obtained from a disk and read into a first buffer and a part of a plurality of data sectors which constitute the ECC block is rewritten, in a system having a first buffer, a second buffer and an encoder for generating the Reed-Solomon code, the method comprising:
(a) transferring new data to the first buffer;
(b) reading original data of the part of the data sectors and the new data from the first buffer, preparing and storing the XOR computation result of the combination of the original data and the new data in the second buffer;
(c) sending the XOR computation result to the encoder for each byte column and maintaining a PO portion relative to a computed result of the source data part; and
(d) performing an XOR computation of the PO portion of original ECC block with the computed result of the PO portion maintained in the step (c) to form the PO portion of the ECC block after updating;
wherein in the step (c), the XOR computation result for the updated data sectors is fed to the encoder in single byte units from the second buffer and 0 is used as the XOR computation result of the non-updated data sectors and is fed to the encoder in plural-byte units.

9. The method according to claim 8 further comprising interleaving a selected part of the source data part of the updated ECC block and one byte row of the PO portion and sequentially writing them to a disk every time one byte row of the PO portion is formed in the step (d).

10. An apparatus having a first buffer, a second buffer and an encoder for generating for encoding the PO portion of an ECC block using a Reed-Solomon code, when the ECC block is obtained from a disk and read into the first buffer and a part of a plurality of data sectors which constitute the ECC block are rewritten, the system comprising:
(a) a member for transferring new data to the first buffer;
(b) a member for reading the original data of the part of the data sectors and the new data from the first buffer, preparing and storing an XOR computation result of combining the original data and the new data in the second buffer;
(c) a member for sending the XOR computation result of the encoder for each byte column and maintaining a PO portion relative to the computed result of the source data part; and
(d) a member for performing the XOR computation of the PO portion of the ECC block with the PO portion maintained in the sending member to form the PO portion of the ECC block after updating; wherein the XOR computation result for each byte column of the updated part of the data sectors is fed to the encoder in single byte units from the second buffer, and 0 is used as the XOR computation result for the non-updated data sectos and encoded in plural-byte units.

11. The apparatus according to claim 10 further comprising: a member for interleaving a selected part of the source data part of the updated ECC block and one byte row of the PO portion and sequentially writing them on the disk every time one byte row of the PO portion is formed by the member.

12. A rewritable DVD reproducing system capable of rewriting data onto a DVD, the rewritable DVD reproducing system comprising:
a motor for rotating the DVD;
an optical element for reading the data recorded on the DVD and writing data on the DVD;
a drive member for operating the motor and the pickup; and
an encoding and decoding member including a decoder for correcting errors in the data read from an ECC block by decoding and an encoder for generating the Reed-Solomon code of the updated ECC block; and
a DVD controller for transmitting the read data to the encoding and decoding member, receiving the written data from the encoding and decoding member and supplying a servo operation command to the drive member based on the reading or writing operation,
the encoding and decoding member further including a first buffer and a second buffer used for forming the PO portion of an ECC block to be updated;
(a) a member for transferring new data to the first buffer;
(b) a member for reading the original data of a part of the data sectors and the new data from the first buffer, preparing and storing the XOR computation result of combining both the original data and the new data in the second buffer
(c) a member for sending the XOR computation result to the encoder for each byte column and maintaining a PO portion relative to a computed result of the source data part; and
(d) a member for performing an XOR computation of the PO portion of the original ECC block with the computed result of the PO portion maintained in the sending member to form the PO portion of the ECC block after updating; and
(e) a writing member for interleaving a selected part of the source data part of the updated ECC block and one byte row of the PO portion and writing them to the disk every time one byte row of the PO portion is formed by the member (d);
wherein the the XOR computation result for each byte column of the updated part of the data sectors is fed to the encoder in single byte units from the second buffer, and 0 is used as the XOR computation result for the non-updated data sectors.

* * * * *